United States Patent [19]

Hiroshima et al.

[11] Patent Number: 4,617,644
[45] Date of Patent: Oct. 14, 1986

[54] HIGH-DENSITY MAGNETIC BUBBLE MEMORY DEVICE

[75] Inventors: Minoru Hiroshima; Shinzo Matsumoto; Mitsuru Sekino; Yoshinori Taniguchi, all of Mobara, Japan

[73] Assignee: Hitachi, Ltd., Tokyo, Japan

[21] Appl. No.: 590,869

[22] Filed: Mar. 19, 1984

[30] Foreign Application Priority Data

Mar. 22, 1983 [JP] Japan .................................. 58-45936

[51] Int. Cl.$^4$ ............................................. G11C 19/08
[52] U.S. Cl. ...................................................... 365/36
[58] Field of Search ..................................... 365/35–44, 365/32

[56] References Cited

U.S. PATENT DOCUMENTS 4,070,658  1/1978  Giess et al. ............................ 365/32
4,237,544  12/1980  Bonyhard ............................ 365/15

OTHER PUBLICATIONS

IBM Journal of Research & Development—vol. 25, No. 4, Jul. 1981; pp. 295–302.
IEEE Transactions on Magnetics—vol. MAG-16, No. 1, Jan. 1980, pp. 93–98.

Primary Examiner—James W. Moffitt
Attorney, Agent, or Firm—Antonelli, Terry & Wands

[57] ABSTRACT

A high-density magnetic bubble memory device using magnetic bubbles having a diameter not larger than 2 μm comprises a magnetic layer capable of sustaining the bubbles therein, and a propagation pattern formed in or on a surface of the magnetic layer. In the device, a relation H/d≦0.8 is satisfied wherein H is the thickness of the magnetic layer and d the diameter of the bubble. When the propagation pattern is made of a permalloy, h/d (h: bubble height in that case) is not larger than 0.8. When the propagation pattern is formed through ion implantation, h'/d (h': bubble height in that case) is not larger than 0.6.

11 Claims, 9 Drawing Figures

HIGH-DENSITY MAGNETIC BUBBLE MEMORY DEVICE

BACKGROUND OF THE INVENTION

The present invention generally relates to a magnetic bubble memory device and in particular to a high-density magnetic bubble memory device using magnetic bubbles having a diameter not larger than 2 μm.

FIG. 1 shows the configuration of a typical magnetic bubble memory device or chip. In FIG. 1, m denotes minor loops for storing information in the form of magnetic bubbles (hereinafter referred to simply as bubbles). RML denotes a read track for transferring information read out and WML denotes a write track for transferring information to be written. A detector D detects bubbles transferred for read-out and a generator G generates bubbles for write-in. A replicate gate R replicates the information from the minor loops m onto the read track RML. A swap gate S swaps the information on the write track WML with the information in the minor loops m. The minor loop m is usually composed of a propagation pattern of elements made of permalloy.

In conventional magnetic bubble memory devices, when high density is desired in such a manner that the period of elements in a propagation pattern composing minor loops is selected to be approximately 6 to 8 μm so that the diameter of the available bubble (defined as a stripe width when a biasing field is zero) will be approximately 1.5 to 2 μm, the bubble propagation characteristic becomes unstable. As a result, a biasing field margin large enough for practical use cannot be expected.

FIG. 2 shows a relationship between the bubble density $\rho$ of the minor loop and the biasing field margin $\Delta H_B$ for a permalloy device in which the bubble diameter is 1.8 μm and the thickness of a magnetic layer defining the height of the bubble is 1.8 μm. Variation of the biasing field margin when more and more bubbles are written into the minor loop is seen in FIG. 2. The bubble density of 100% refers to a state wherein bubbles are loaded in all addresses of the minor loop, i.e., a full load state.

It is apparent from FIG. 2 that the biasing field margin $\Delta H_B$ is sufficiently high when the bubble density $\rho$ is low but $\Delta H_B$ decreases as $\rho$ increases. The margin $\Delta H_B$ for the $\rho$ value of 100% is decreased to half as compared with the value in normal use and hence is insufficient for practical use.

SUMMARY OF THE INVENTION

An object of the present invention is to provide a magnetic bubble memory device which operates stably because of less decrease in the biasing field margin for a given increase in the bubble density of the minor loop.

To attain the object, in a device according to the present invention using bubbles whose diameter d is not larger than 2 μm, a relation of $H/d \leq 0.8$ is satisfied wherein H is the thickness of a magnetic layer capable of sustaining bubbles.

In accordance with one aspect of the present invention, for a permalloy device having a propagation pattern made of a permalloy formed directly or indirectly on the magnetic layer, a ratio h/d is not larger than 0.8, preferably is in a range from 0.8 to 0.55, where h represents the height of the bubble present in the magnetic layer.

In accordance with another aspect of the present invention, for an ion-implanted device having a propagation pattern formed through ion implantation into the magnetic layer, a ratio h'/d is not larger than 0.6, where h' represents the height of the bubble present in a non-implanted thickness portion of the magnetic layer.

The "bubble diameter" used throughout the specification means the stripe width $w_s$ when a biasing field perpendicular to the magnetic layer is zero.

DESCRIPTION OF THE PREFERRED EMBODIMENTS

The present invention will now be described in detail by referring to embodiments.

Figure 1:
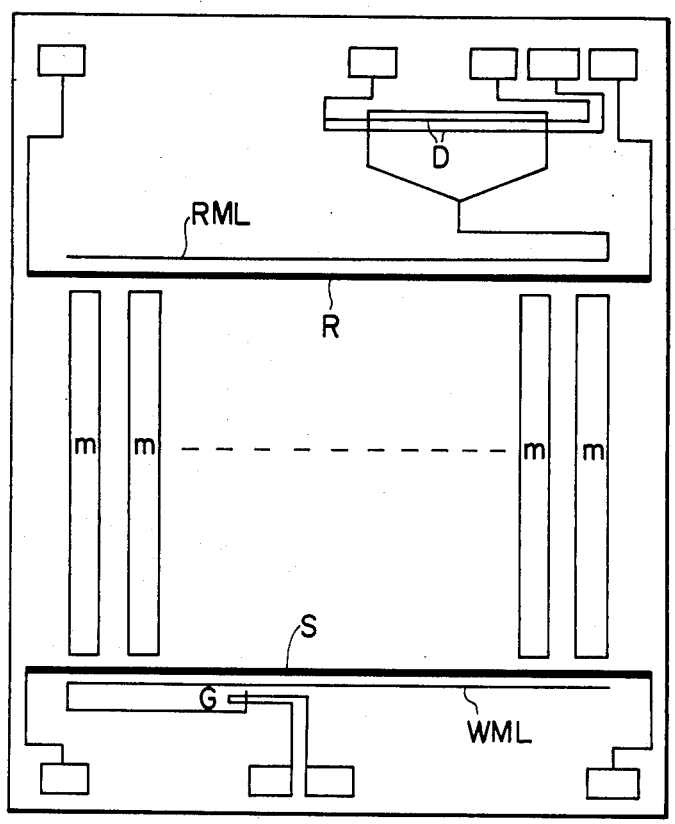
FIG. 1 shows the configuration of a typical magnetic bubble memory device.
Figure 2:
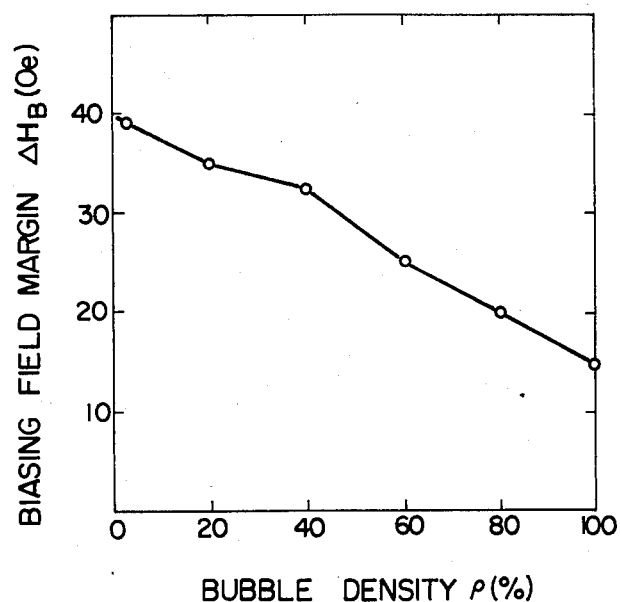
FIG. 2 shows a relationship between the bubble density $\rho$ of the minor loop and the biasing field margin $\Delta H_B$ in a conventional magnetic bubble memory device.

The present inventors supposed that the decrease in the biasing field margin attendant upon an increase in the bubble density as illustrated in FIG. 2 is caused by interactions between bubbles and that the interactions may be decreased by relatively lowering the height of the bubble used.

Figure 3:
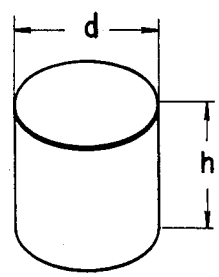
FIG. 3 is a perspective view for illustrating the diameter and height of the bubble.

FIG. 3 shows the height h and the diameter d of the bubble. In a conventional permalloy device using bubbles having a diameter not larger than 2 μm, h was close to d. For example, h was 1.8 μm and d was 1.8 μm. In order to examine the optimum value of the ratio h/d, the present inventors fabricated various permalloy device samples in which the diameter d of the bubble usually set for reason of operational characteristic at one fourth to one third of the period λ of elements in a permalloy propagation pattern composing a minor loop is 1.5 μm and the thickness H of a magnetic layer 2 (see FIG. 5a) having permalloy propagation elements 3 formed thereon through a spacer layer of $SiO_2$ (not shown) is varied. To obtain the different magnetic layer thicknesses while providing a constant bubble diameter (1.5 μm), the composition ratios of compounds forming the magnetic layer 2, the growth temperatures for the magnetic layer, etc. were changed. Even if the composition ratios are unchanged, different bubble diameters are available when the thickness of the layer to be formed is changed.

Figure 4:
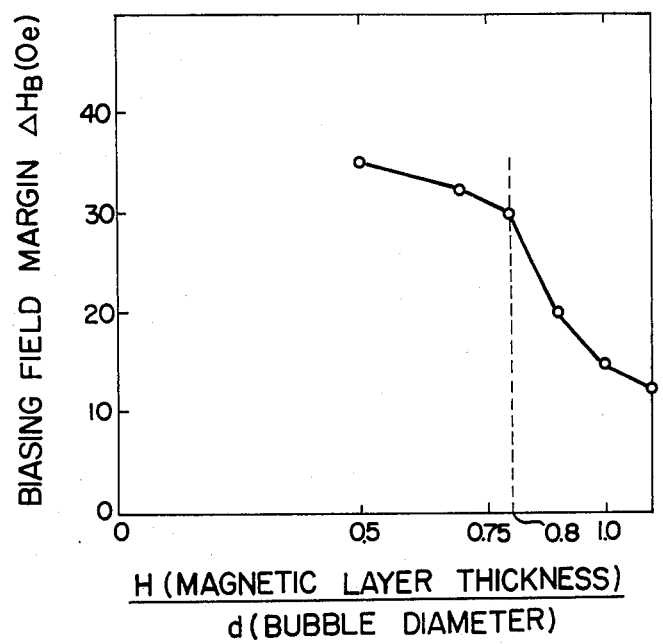
FIG. 4 shows the results of measurements of biasing field margin $\Delta H_B$ for permalloy device samples having different ratios of the magnetic layer thickness H to the bubble diameter d.
Figure 5A:
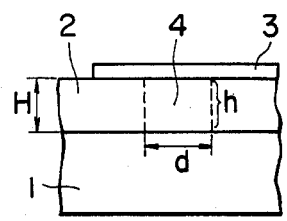
FIGS. 5a, 5b and 5c are sectional views for illustrating structures of a permalloy device, an ion-implanted single-layer device, and an ion-implanted double-layer device, respectively.

FIG. 4 shows the results of measurements of the biasing field margin $\Delta H_B$ for the above-described samples (H/d = 1.1, 1.0, 0.9, 0.8, 0.7 and 0.5) under a condition that the bubble density $\rho$ of the minor loop is 100%. In the measurement, the magnitude $H_R$ of a rotating field, the operation frequency f, and the operation temperature T were chosen to be 55 Oe, 100 kHz, and 0° C., respectively. It is appreciated from FIG. 4 that the biasing field margin $\Delta H_B$ has a value large enough for practical use when the ratio H/d is not larger than 0.8. In a permalloy device as illustrated in FIG. 5a, the height h of the bubble is defined by the thickness H of the magnetic layer 2. Accordingly, the value of H/d illustrated in FIG. 4 may be considered to be equivalent to the value of h/d.

Figure 6:
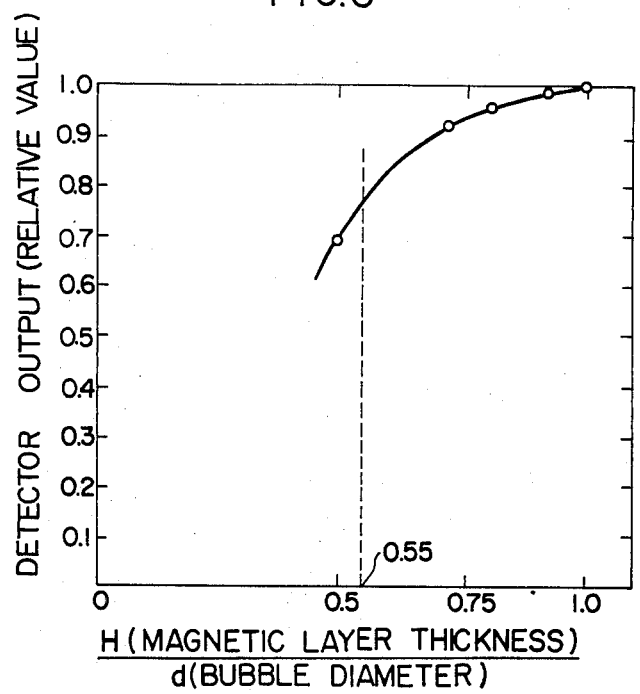
FIG. 6 shows the results of measurements of detector outputs for samples used in FIG. 4.

FIG. 6 shows the results of measurements of bubble detector outputs when the above-described samples are used. The output values on the ordinate are normalized by the output for a sample having a ratio H/d=1.0. As seen in FIG. 6, the detector output is significantly lowered when the value of H/d or h/d is too small. If the value of H/d or h/d is 0.55 or more, the decrease in the detector output is not larger than 20%, posing no problem for practical use.

Figure 7:
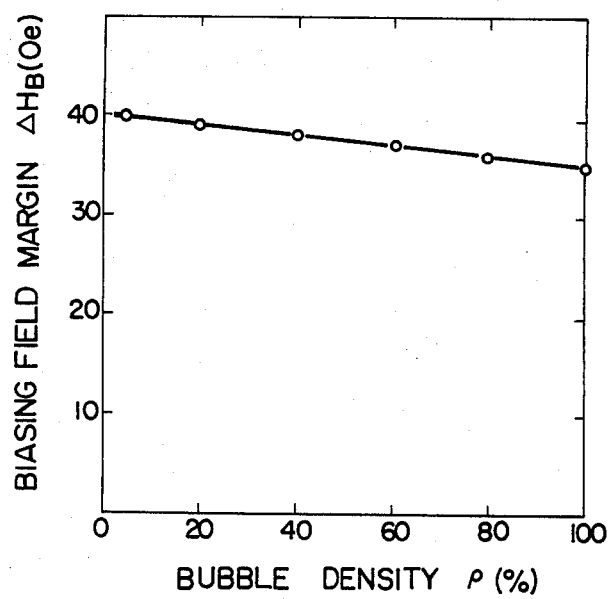
FIG. 7 shows a relationship between the bubble density $\rho$ of the minor loop and the biasing field margin $\Delta H_B$ for a permalloy device sample having a particular ratio of H/d.

FIG. 7 shows the results of measurements of the biasing field margin $\Delta H_B$ with respect to the bubble density $\rho$ of the minor loop for a sample in which d=1.8 $\mu$m and H=1.4 $\mu$m so as to satisfy a relation of H/d=0.78≦0.8. As compared with the biasing field margin at a bubble density $\rho$ close to zero, a decrease in the biasing field margin when the bubble density $\rho$ has reached 100% is approximately 20%. This sample with d=1.8 mm and H=1.4 mm was obtained by growing a magnetic layer of $(Y_{1.0} Sm_{0.5} Lu_{0.7} Ca_{0.8})(Fe_{4.2} Ge_{0.8})O_{12}$ on a substrate at 920° C. The period $\lambda$ of a permalloy pattern formed on the magnetic layer was chosen to be 6.0 $\mu$m.

As evident from the foregoing, in a permalloy device using bubbles having a diameter not larger than 2 $\mu$m, a biasing field margin large enough for practical use may be obtained when H/d or h/d is not larger than 0.8. For preventing a substantial decrease in the detector output due to a decrease in H/d or h/d, it is desirable that H/d or h/d is in a range from 0.8 to 0.55. The decrease in the detector output may be prevented by making the detector film thinner. However, it is inconvenient in permalloy devices to make only the detector film thinner, because the detector film is usually formed in the same fabrication step as the permalloy propagation pattern.

In permalloy devices, a small quantity of ions such as Ne or He may be sometimes implanted in the surface of the magnetic layer 2 for hard bubble suppression. When the thickness of the magnetic layer is 1.0 $\mu$m, for example, ions may be implanted at the depth of approximately 0.1 $\mu$m. The spacer layer of $SiO_2$ (not shown) interposed between the magnetic layer 2 and the permalloy elements 3 can be omitted.

Figure 5B:
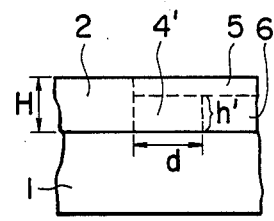

The present inventors also carried out similar experiments for a so-called ion-implanted device as illustrated in FIG. 5b in which ions are implanted with a predetermined pattern in a magnetic layer 2 until a depth close to one third of the thickness H of the layer 2 so that a propagation pattern is defined by the edges of an ion-implanted thickness portion 5. The experiments yielded results similar to those of FIG. 4. In this case as well, a biasing field margin large enough for practical use is obtained if H/d is not larger than 0.8. In the implanted device, a bubble 4' is sustained in a non-implanted thickness portion 6 of the magnetic layer 2. Assuming that the height of the bubble 4' is h', therefore, a condition that the value of H/d is not larger than 0.8 means that h'/d is not larger than approximately 0.6.

For implanted devices, the decrease in the detector output due to a decrease in h'/d is not a significant problem because it can be easily prevented by making the detector film thinner or placing the detector film immediately on the magnetic layer.

Figure 5C:
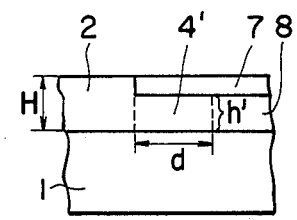

The present invention has heretofore been described referring to specific embodiments, but the present invention is not restricted to these embodiments. For example, although FIG. 5b shows the implanted device in which the magnetic layer 2 has a single-layer structure made of the same material and in which ions are implanted in the surface of the layer 2, the present invention may also be applied to an ion-implanted device as shown in FIG. 5c in which a magnetic layer 2 has a double-layer structure including an upper layer 7 and a lower layer 8 made of different materials respectively and in which ions are implanted in the upper layer 7 in which ions can be easily implanted. In an implanted double-layer device as well, a biasing field margin large enough for practical use may be obtained provided that H/d is not larger than 0.8 or h'/d is not larger than 0.6.

An implanted double-layer device with d=1 $\mu$m, H=1.4 $\mu$m and h'=1.0 $\mu$m and hence with H/d=1.4 or h'/d=1.0 is disclosed in IEEE TRANSACTIONS ON MAGNETICS, Vol. MAG-16, No. 1, pp. 93-98, January 1980. An implanted single-layer device with d=1 $\mu$m and H=1.24 $\mu$m and hence with H/d=1.24 as well as an implanted double-layer device with d=1 $\mu$m, H=1.16 $\mu$m and h'=0.8 $\mu$m and hence with H/d=1.16 or h'/d=0.8 are disclosed in IBM J. RES. DEVELOP. Vol. 25, No. 4, pp. 295-302, July 1981. These implanted devices having the value of H/d or h'/d thus disclosed will not provide the effect attained by the present invention.

In a magnetic bubble memory device according to the present invention as heretofore described, the thin form of the bubble reduces interactions between bubbles. Even when the bubble density of the minor loop is increased, therefore, a sufficiently large biasing field margin can be obtained and hence the stability of the operation can be improved.

What is claimed:

1. A magnetic bubble memory device comprising a substrate, a magnetic layer which has a thickness H including an ion implanted layer at the surface thereof and in which magnetic bubbles having a diameter d not larger than 2 $\mu$m can be sustained, and a propagation pattern for propagating the magnetic bubbles in said magnetic layer, a relation of H/d≦0.8 being satisfied.

2. A magnetic bubble memory device according to claim 1, wherein said propagation pattern is made of a permalloy covering said magnetic layer.

3. A magnetic bubble memory device according to claim 2, wherein H/d is in a range from 0.8 to 0.55.

4. A magnetic bubble memory device according to claim 2, wherein ions are implanted in said magnetic layer until a predetermined relatively small depth for hard bubble suppression.

5. A magnetic bubble memory device comprising a substrate, a magnetic layer which has a thickness H and in which magnetic bubbles having a diameter d not larger than 2 $\mu$m can be sustained, and a propagation pattern for propagating the magnetic bubbles in said magnetic layer, a relation of H/d≦0.8 being satisfied, wherein ions are implanted with a predetermined pattern in said magnetic layer until a predetermined depth, said propagation pattern being defined by the edges of an implanted thickness portion of said magnetic layer, and h'/d is not larger than 0.6, h' being the height of the magnetic bubble present in a non-implanted thickness portion of said magnetic layer.

6. A magnetic bubble memory device according to claim 5, wherein said magnetic layer has a single-layer structure made of the same material.

7. A magnetic bubble memory device according to claim 5, wherein said magnetic layer had a double-layer structure including upper and lower layers made of different materials respectively, the ions being implanted in said upper layer.

8. A magnetic bubble memory device comprising a magnetic layer, with an ion implanted layer at the surface thereof, in which magnetic bubbles having a diameter d not larger than 2 $\mu$m can be sustained and, a propagation pattern for propagating the magnetic bubbles in said magnetic layer, wherein a relation of h'/d $\leq$ 0.6 is satisfied, h' being the thickness of the non-implanted layer portion of said magnetic layer.

9. A magnetic bubble memory device according to claim 8, wherein said propagation pattern is made of a permalloy layer covering said magnetic layer.

10. A magnetic bubble memory device according to claim 8, wherein said magnetic layer has a single-layer structure made of the same material, and said ion implanted layer is patterned to form said propagation pattern.

11. A magnetic bubble memory device according to claim 8, wherein said magnetic layer has a double-layer structure including upper and lower layers made of different materials, respectively, and said ion implanted layer comprises said upper layer and is patterned to form said propagation pattern.

* * * * *